United States Patent [19]

Fuoco

[11] Patent Number: 5,103,168

[45] Date of Patent: Apr. 7, 1992

[54] STRESS TESTING EQUIPMENT WITH AN INTEGRAL COOLING PLENUM

[75] Inventor: Francis J. Fuoco, Commack, N.Y.

[73] Assignee: Grumman Aerospace Corporation, Bethpage, N.Y.

[21] Appl. No.: 263,453

[22] Filed: Oct. 27, 1988

[51] Int. Cl.⁵ ............................................. G01R 15/12
[52] U.S. Cl. ................................ 324/158 F; 324/73.1
[58] Field of Search .......... 324/158 F, 158 P, 73 PC, 324/73 R; 361/412, 413, 415, 394, 399; 374/5, 7, 8, 43, 45, 57; 165/61, 48.1

[56] References Cited

U.S. PATENT DOCUMENTS 4,145,620 3/1979 Dice .
4,468,616 8/1984 Yoshizaki .

OTHER PUBLICATIONS

Bruder et al., "Carrier Card Assembly for Component Aging"-IBM Technbical Disclosure Bulletin, vol. 14, No. 3, Aug. 1971, p. 737.
Belyeu et al., "Dynamic Burn-In System", IBM Technical Disclosure Bulletin, vol. 22, No. 8A, Jan. 1980, pp. 3065-3068.

Primary Examiner—Reinhard J. Eisenzopf
Assistant Examiner—Edward Urban
Attorney, Agent, or Firm—Pollock, VandeSande & Priddy

[57] ABSTRACT

To prevent degradation of the connectors which connect a driver board to a carrier board, the present invention stress testing equipment positions its connectors at the rear of a moderate temperature section, away from a high temperature oven chamber of the testing equipment. By sealing the interface barrier between the high temperature chamber and the moderate temperature section and by circulating cool air through the moderate temperature section, a temperature gradient is effected along the length of the portion of the carrier board that is located within the moderate temperature section. Accordingly, the connectors located at the interface between the moderate temperature section and the ambient temperature section no longer are exposed to a high temperature environment, thereby no longer succumbing to material fatigue or degradation, albeit the electronic components carried on the portion of the carrier card that is exposed to the high temperature environment in the oven chamber continue to be stress tested in the high temperature environment.

2 Claims, 3 Drawing Sheets

STRESS TESTING EQUIPMENT WITH AN INTEGRAL COOLING PLENUM

FIELD OF THE INVENTION

The present invention relates to test equipment and more particularly to an instrument for burned-in testing of electrical or electronic components, in order to find out whether these components have inherent faults which would not be apparent without the components being stressed tested.

BACKGROUND OF THE INVENTION

Burned-in equipment are known. Typically, such equipment includes an oven chamber in which a number of to-be-tested electronic components are contained and heated to a constant high temperature, to mimic a worst condition scenario, so that the defective components would fail in a much shorter time than otherwise required. Such equipment oftentimes include a low or ambient temperature section that contains the necessary driving circuit for generating signals to operate the components while the same are being heated in the high temperature chamber. To provide connection between the to-be-tested components and driving circuit, the components and the driving circuit are ordinarily placed onto respective printed circuit (PC) boards (cards) and are connected by means of connectors at the junction of the two chambers.

Examples of this type of testing equipment are disclosed in U.S. Pat. Nos. 4,145,620 and 4,468,616. In the '620 Patent, a burned-in chamber which includes an oven and a bay module is disclosed. The bay module has a number of signal distribution cards which are connected to corresponding socket cards that bear the to-be-tested components. At the back panel of the bay module, and mated to each of the signal distribution cards, is a driver card that contains the electronics for operating the components on the corresponding socket cards. In addition to the driver cards, a pattern generator card is also used. Further required are a great number of wires which interconnect between the signal distribution cards, for providing the signals from the pattern generation card to the different socket cards. Thus, a large number of wires, in addition to the already numerous leads on the signal distribution cards, are needed for the '620 device.

Needless to say, the many wires present the problem of unreliability, as one of the wires may inadvertently break. Moreover, the socket cards are connected to the signal distribution cards by means of connectors, which are located in the oven of the burned-in chamber and thus are exposed to a high temperature environment. And if exposed to the high temperature environment for an extended period of time, metal degradation, more specifically metal fatigue for the beryllium contacts in the connectors, occurs. Consequently, no longer would there be accurate interfacing between the components in the oven and the driver circuits on the driver cards. Furthermore, inasmuch as the driver cards are located outside of the burned-in chamber and are thus unprotected, mishaps affecting the integrity of the driver cards become inevitable.

The equipment disclosed in the '616 Patent is divided into a high temperature section, a low temperature section and a connecting unit section. In the high temperature section are contained the PC cards bearing the to-be-tested components. In the low temperature section are the PC cards containing the driving circuits for activating the to-be-tested components. Connecting the two types of cards are sets of corresponding pairs of connectors—one located at the junction between the high temperature section and the connecting unit section, and the other located at the junction between the low temperature section and the connecting unit section. To connect the pairs of connectors, sets of large number of conductor pins are used.

As was with the case of the '620 device, inasmuch as one of the connectors in the '616 device is continuously exposed to the heat from the high temperature section, the integrity of the measurement is affected by the exposed connector. Also, since only conductor pins are used to connect the corresponding pairs of connectors, the reliability of the '616 equipment is affected when one or more of these connecting pins are bent, as the different PC boards are pushed into the connectors.

BRIEF DESCRIPTION OF THE PRESENT INVENTION

It is an object of the present invention to provide for an improved burned-in testing equipment which is devoid of the aforenoted problems, so as to improve the integrity of the measurements obtained and to enhance the life expectancy of the different connectors.

For the large number of integrated circuit (IC) components on the market that require different burned-in temperatures, it is another objective of the present invention to provide for a test equipment that is capable of generating a temperature gradient which, having different temperatures, can be used to stress test different IC components without the temperature in the oven of the equipment having to be readjusted.

In particular, the present invention test equipment is divided into three sections: a high temperature section, a moderate temperature section (or plenum), and an ambient temperature section. At the barrier between the ambient temperature section and the moderate temperature section, connectors, the number of which varies, are positioned. At least one carrier card—for particularly fitting into the high temperature section and the moderate temperature section, and onto which the to-be-tested electronic or electrical components are placed—is mated to the connector, through the moderate temperature section. At least one corresponding driver card having either mounted or etched thereon the driving circuit(s) for operating the components on the corresponding carrier card is mated to the corresponding connector in the ambient temperature section. The configuration of the carrier card is such that, when mated with the connector, the portion remaining in the high temperature section would prevent the heat in the same section from escaping into the moderate temperature section. A sealing gasket, attached either to the carrier card or an interfacing slot between the high and moderate temperature sections, may also be used to further enhance the seal between the two sections.

Inside the moderate temperature section plenum, a temperature gradient which ranges from moderately hot to essentially ambient temperature is effected by convection of heat from the carrier card, as no heat from the high temperature section directly escapes therein. Accordingly, in addition to testing components which need to be stress tested in a high temperature environment, components which can only be tested in a moderate temperature environment can also be tested at the same time, by being carried onto the carrier card at its portion which extends into the moderate temperature section. In the meantime, since the connectors are not exposed to a high temperature environment, no degradation thereof occurs. Furthermore, insofar as only PC cards are used, the reliability and the repeatability of measurement results from the present invention equipment are greater than those of the existing equipment.

The above-mentioned objectives and advantages of the present invention will become more apparent and the invention itself will be best understood by reference to the following description of an embodiment of the invention taken in conjunction with the accompanying drawings, wherein:

DETAILED DESCRIPTION OF THE INVENTION

Figure 1:
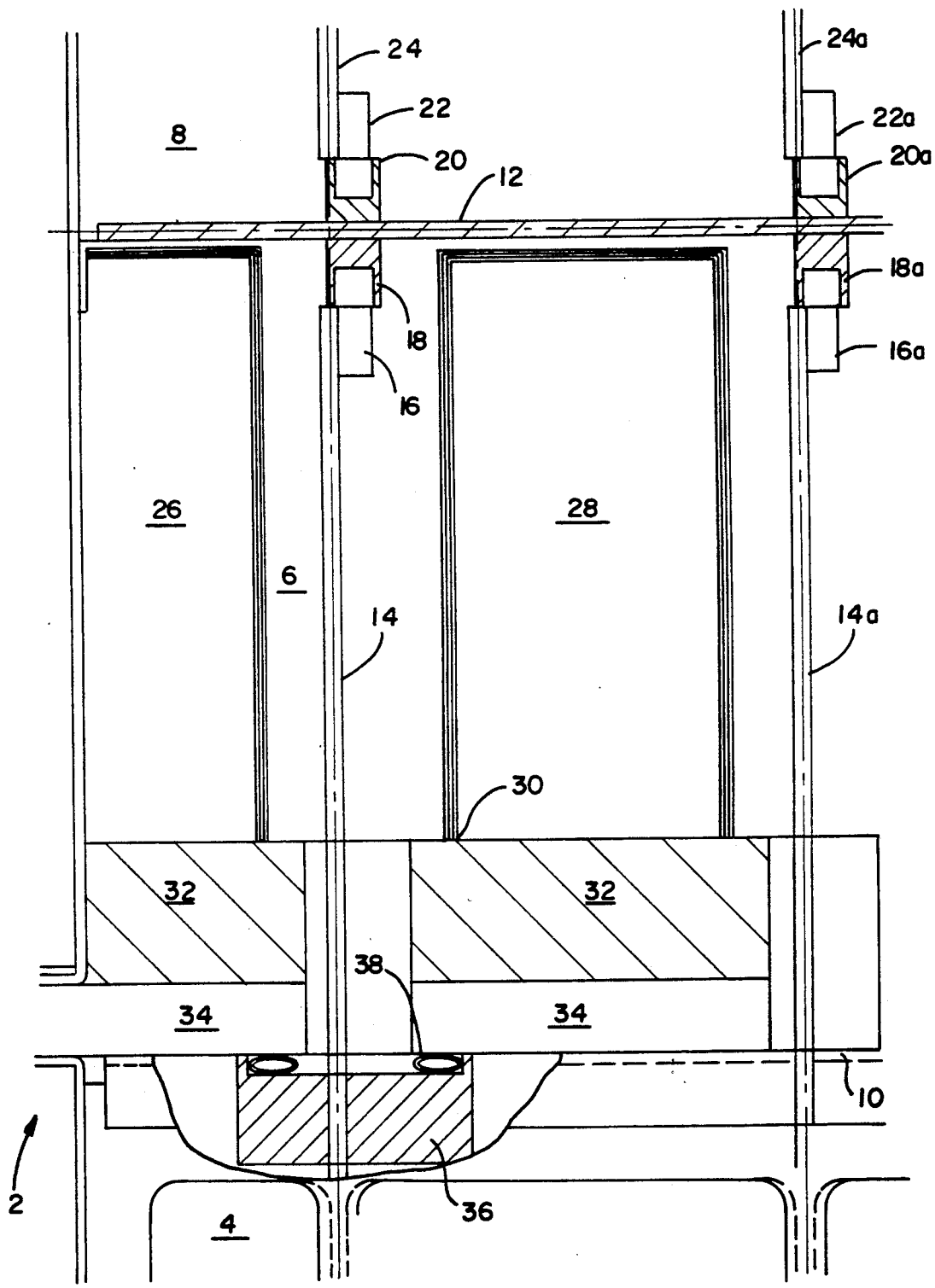
FIG. 1 is a cross-sectional view of the present invention equipment, showing the interconnection between the different sections.

The present invention burned-in testing equipment 2, with reference to FIG. 1, is shown to be divided into three sections: a high temperature section 4 which can be equated with an oven chamber, a moderate temperature section or integral plenum 6 and an ambient temperature section 8. As shown, high temperature section 4 is separated from moderate temperature section 6 by a wall 10; while moderate temperature section 6 is separated from ambient temperature section by a board or card 12. In the oven, the temperature may be adjusted to, for example, 200° C.; while the temperature within plenum 6 varies from approximately 65° to 25° C.

As shown, a carrier card or board 14 (partially shown in section 4) extends from the oven (section 4) into moderate temperature section (plenum) 6. The end of carrier card 14 is fitted with a conventional AMP-HDI type connector 16 which may be obtained from the AMP Corporation of Harrisburg, Pa. Connector 16 is mated to a corresponding connector 18, surrounded by a shroud, which is integrated into card 12. Like connector 16, connector 18 may also be obtained from the AMP Corporation. It should be noted that these connectors can be either male or female, although for this example, connector 18 is a male connector while connector 16 is a female connector. It should be appreciated, however, that these two connectors may actually be replaced by one connector. Coupled to board 12 and inside ambient temperature section 8 is a corresponding connector 20, also surrounded by a shroud. It should be appreciated that connector 20 and connector 18 may also be comprised of a single connector or are mated to each other in a well known procedure. Mated to connector 20 is a connector 22 which is similar to connector 16 and to which is connected a driver card 24 having mounted thereon the necessary electronics for driving the IC components, which are mounted onto carrier card 14. In effect, instead of having four connectors 16, 18, 20 and 22, only two connectors jointed to each other across board 12 need to be used. For the sake of simplicity, none of the IC components or the electronics is shown on cards 14 and 24, respectively.

Moderate temperature section 6 is packed with lose pack insulation at, for example, metal containment compartments 26 and 28. To prevent any metal surface from coming into contact with the oven wall, there is a typical thermal break at position 30. To further insulate moderate temperature section 6 from high temperature section 4, dense pack insulation 32, as well as thermal barriers 34 made with Haysite materials, are used. To prevent heat from escaping from the oven into moderate temperature section 6, besides the configuration of carrier card 14 (to be seen with respect to FIGS. 2 and 3, and to be discussed later), a sealer (or a gasket) 36, shown with silicone tubing seal 38, is used. This sealer may be mounted onto oven wall 10 or directly onto carrier card 14, as the positioning of sealer 36 is important only inasmuch as it is used to further insure that no heat would directly escape from high temperature section 4 into moderate temperature section 6. A conventional type of sealing gasket may be employed and would provide adequate seal for the instant invention.

It should be appreciated that what is shown in FIG. 1 is but a section of the present invention equipment, as a plurality of carrier cards and connectors, such as 14a and 16a to 24a, can also be included. As is well known, the power supplied to driver card 24 for activating the IC components on carrier card 14 is fed from card 12, which itself may be made from a PC board and has mated thereto power from some power generator (not shown).

Figure 2:
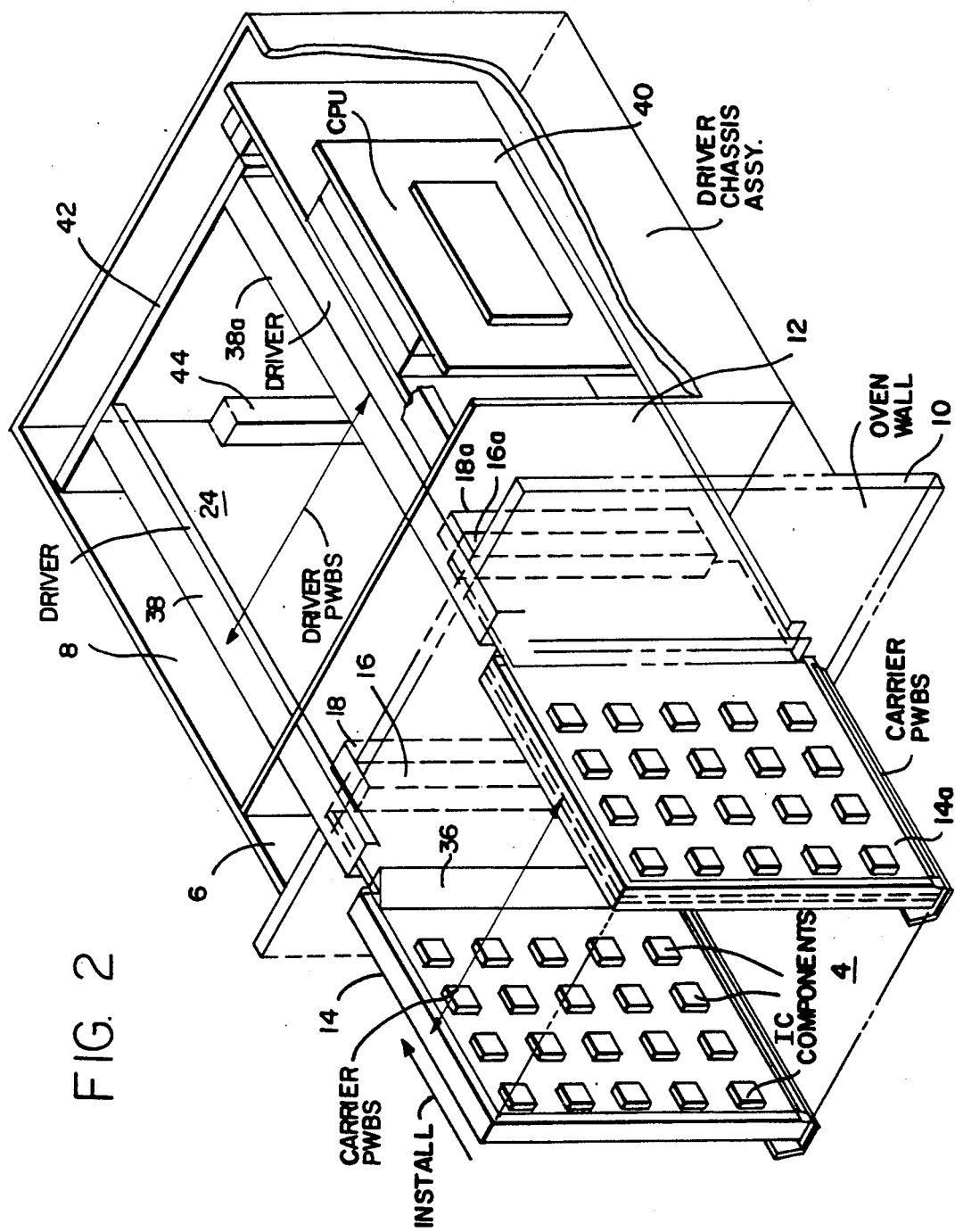
FIG. 2 is a simplified isometric view of the present invention.

A perspective view of the present invention may be gleaned from FIG. 2 wherein it can be seen that carrier card 14 is mated to driver card 24 along guide 38. Although only carrier cards 14 and 14a are shown, it should be appreciated that a plurality of carrier cards, identified as carrier printed wire boards (PWBS) may also be utilized. Likewise, a corresponding number of driver cards, such as 24, may also be included in ambient section 8 of the equipment. As shown, a number of additional PC boards, each suited for a particular function such as for monitors, memory, etc., are connected to board 12 in ambient temperature section 8. These boards, such as the CPU board, are summarily identified as 40 in FIG. 2.

Also to be noted in FIG. 2 is the connection between driver card 24 and yet another PC card or board 42, by means of connector 44. Although not shown for the sake of clarity, to the back of board 42 is a corresponding connector jointed to connector 44 which would allow a technician to interface, in real-time, with the goings-on of the IC components on the carrier card and the electronics, including the driving circuits, on driver card 24. Needless to say, the number of connectors 44, and their corresponding connectors behind board 42, varies depending on the number of driver cards in this system. It should further be appreciated that, although no IC components are shown in the portion of carrier card 14 that is situated in moderate temperature section 6, IC components are indeed capable of being carried on that portion of the carrier card for stress testing.

Figure 3:
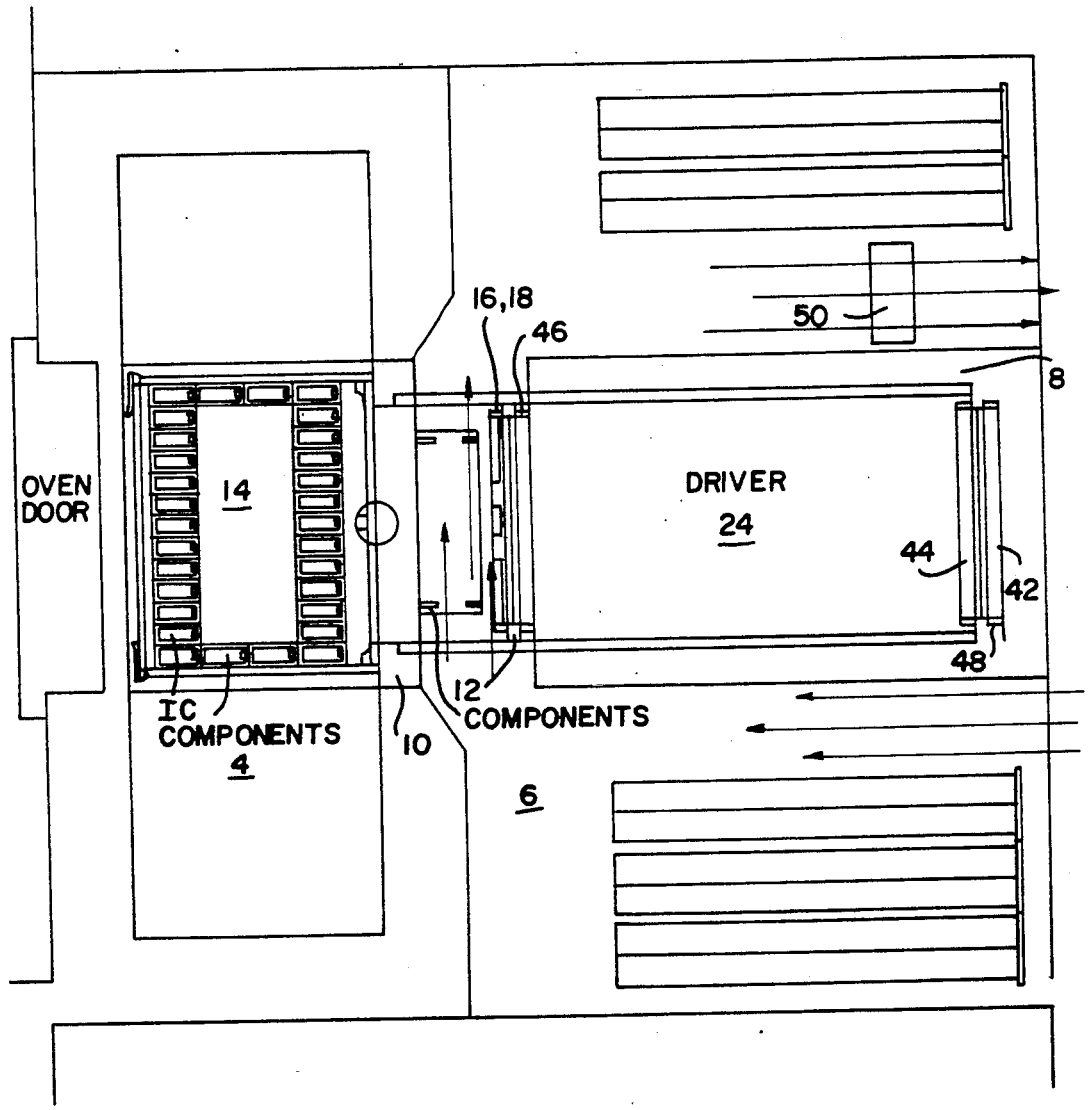
FIG. 3 is a cut-away plan view of the overall present invention equipment.

The overall workings of the present invention system can be best understood with reference to FIG. 3. There, it can be seen that carrier card 14, having a number of IC components on its portion residing in high temperature section 4 and a smaller number of components residing in moderate temperature section 6, is mated, by means of connector 16 and 18, to driver card 24. It should be appreciated that driver 24 is mated to carrier card 14, through board 12, by means of a similar connector (or connectors) 46. It should further be appreciated that by means of connector 44, driver card 24 is connected to a connector 48 mounted to rear board 42, from which electrical connection allowing technician to monitor the operations of the IC components and the carrier and driver cards in a real-time basis is achieved.

As previously discussed, the portion of carrier card 14 residing in high temperature section 4 is larger than the portion residing in moderate temperature section 6. Thus, as seen from FIGS. 2 and 3, carrier card may be said to have a T shape. As can be seen from FIG. 3, when mated, the larger portion of carrier card 14, since it, with or without sealer 36, is larger than the slot through which its smaller portion extends into moderate temperature 6, would prevent heat in high temperature section 4 from escaping directly into moderate temperature section 6.

In moderate temperature section 6, since carrier card 14 is basically a metal plate covered with plastic, heat is transferred from the larger portion to the smaller portion of carrier card 14. And as heat is dissipated, by means of convection from the smaller portion of carrier card 14, the temperature in moderate temperature section 6 is increased. Insofar as there is more heat at the smaller portion of carrier card 14 which is closest to oven wall 10 (approximately 65° C.) than the small portion which is closest to board 12 (approximately 25° C.), a temperature gradient exists across moderate temperature section 6, along the length of the smaller portion of carrier card 14. Thus, IC components which require stress testing at temperatures lower that in high temperature section 4 may be tested, instead, in moderate temperature section 6, by being carried onto the smaller portion of carrier card 14, at different positions along the length thereof. To maintain a certain temperature gradient in moderate temperature section 6, a fan 50 for circulating cooling air, indicated by the arrows, within moderate temperature section 6 is used.

In operation, to replace the carrier card(s), the oven door is removed, the carrier card(s) is removed and new one(s) inserted into the appropriate connector(s). Likewise, the driver cards may be removed from ambient temperature section 8 through the back of driver chassis assembly (See FIG. 2). Different functioning cards 40 can also be replaced. Thus, the instant invention system is capable of testing with ease a myriad of IC components, with various stress temperatures and with different functions. And inasmuch as the connectors for mating the carrier cards to the driver cards are not exposed to the heat from the oven chamber, not even for a short period of time, there is no degradation of the metal contacts, or the plastic bodies, of the connector. Accordingly, reliability of the present invention system is much greater than that of previous similar testing equipment.

Insofar as the present invention is subject to many variations, modifications and changes in detail, it is intended that all matter described throughout this specification and shown in the accompanying drawings be interpreted as illustrative only and not in limiting sense. Accordingly, it is intended that the invention be limited by the spirit and scope of the appended claims.

I claim:

1. Apparatus for stress testing electronic components, comprising:
   a high temperature chamber in which electronic components are stress tested, the components being carried into the high temperature chamber on at least one printed circuit carrier card;
   an ambient temperature section having at least one printed circuit driver card positioned therein, the driver card including at least one driving circuit for generating signals to operate electronic components;
   a moderate temperature section sandwiched between the high temperature chamber and the ambient temperature section, and into which a portion of the carrier card is extended, the moderate temperature section having a temperature gradient ranging from moderate at an interface wall between the high temperature chamber and the moderate temperature section to close to ambient temperature at an interface barrier between the moderate temperature section and the ambient temperature section;
   means for circulating air through the moderate temperature section for carrying away the heat resulting from convection by the portion of the carrier card extended into the moderate temperature section;
   wherein the temperature gradient within the moderate temperature section provides for stress testing of electronic components which need to be stress tested at temperatures lower than that within the high temperature chamber;
   connecting means fixed proximately to the interface barrier between the ambient and moderate temperature sections for mating the carrier card to the driver card, such that the electronic components on the carrier card are operated in response to the generated signals from the driver card;
   wherein the connecting means, being arranged in a substantial ambient temperature environment, is immune to material fatigue and degradation resulting from extended exposure in a high temperature environment.

2. Apparatus for burn-in testing of electronic components, comprising:
   at least one carrier card carrying thereon electronic components for burn-in testing;
   at least one corresponding driver card including at least one driving circuit for generating signals to operate the electronic components;
   a high temperature chamber into which a first portion of the carrier card is positioned, the electronic components carried on the first portion of the carrier card being stress tested in a high temperature environment;
   a moderate temperature section separated from the high temperature chamber by a barrier wall, a second portion of the carrier card extending from the first portion being positioned therein, the moderate temperature section having a temperature gradient which is at its peak at the barrier wall and decreases as a function of the distance away from the wall;
   an ambient temperature section positioned adjacent to the moderate temperature section and inside of which the driver card is located;
   interface means separating the moderate temperature section from the ambient temperature section;
   connecting means mounted to the interface means for respectively mating with the carrier card and the driver card, the connecting means providing an electrical communicating link between the carrier and driver cards, such that the electronic components on the carrier card are driven by the signals generated by the driving circuit on the driver card;

wherein the carrier card carries thereon electronic components in both of its first and second portions, the electronic components in the first portion being subjected to high temperature stress testing and the different electronic components on the second portion being subjected to stress testing under corresponding different temperatures;

wherein, since the interface means is not exposed to the heat from the high temperature chamber and since the connecting means is mounted to the interface means, the connecting means is immune to material fatigue and degradation resulting from prolonged exposure in a high temperature environment.

* * * * *

UNITED STATES PATENT AND TRADEMARK OFFICE
CERTIFICATE OF CORRECTION

PATENT NO. : 5,103,168

DATED : April 7, 1992

INVENTOR(S) : Francis J. Fuoco, et al.

It is certified that error appears in the above-identified patent and that said Letters Patent is hereby corrected as shown below:

Column 5, line 31, after "lower" insert --than--.

Signed and Sealed this

Twenty-second Day of June, 1993

Attest:

MICHAEL K. KIRK

*Attesting Officer*   *Acting Commissioner of Patents and Trademarks*